(12) United States Patent
Jin (10) Patent No.: US 11,425,832 B2
(45) Date of Patent: Aug. 23, 2022

(54) DISPLAY DEVICE AND DISPLAY EQUIPMENT

(71) Applicant: Wuhan China Star Optoelectronics Semiconductor Display Technology Co., Ltd., Hubei (CN)

(72) Inventor: Zengjian Jin, Hubei (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 71 days.

(21) Appl. No.: 17/054,785

(22) PCT Filed: Jun. 30, 2020

(86) PCT No.: PCT/CN2020/099108
§ 371 (c)(1),
(2) Date: Nov. 12, 2020

(87) PCT Pub. No.: WO2021/227215
PCT Pub. Date: Nov. 18, 2021

(65) Prior Publication Data
US 2022/0141980 A1    May 5, 2022

(30) Foreign Application Priority Data
May 12, 2020 (CN) .......................... 202010395470.8

(51) Int. Cl.
*H05K 7/02* (2006.01)
*H05K 7/04* (2006.01)
*H05K 5/02* (2006.01)
*H05K 5/00* (2006.01)

(52) U.S. Cl.
CPC ......... *H05K 5/0226* (2013.01); *H05K 5/0017* (2013.01)

(58) Field of Classification Search
USPC .................................. 361/807, 728, 809, 810
See application file for complete search history.

(56) References Cited

U.S. PATENT DOCUMENTS

| 10,228,729 | B2* | 3/2019 | Yamazaki | ............. G06F 1/1652 |
| 2005/0253834 | A1 | 11/2005 | Sakamaki et al. | |
| 2016/0187684 | A1 | 6/2016 | Zhang et al. | |
| 2017/0139442 | A1 | 5/2017 | Yoshizumi | |
| 2017/0310799 | A1* | 10/2017 | Lin | ....................... G06F 1/1652 |

FOREIGN PATENT DOCUMENTS

| CN | 101039555 | 9/2007 |
| CN | 204667936 | 9/2015 |
| CN | 206575463 | 10/2017 |

(Continued)

*Primary Examiner* — Hung S. Bui (57) ABSTRACT

A display device is provided, which includes at least two display parts and at least one bending part. The bending part is disposed between two adjacent display parts. When the bending part is bent, the display parts are located on different planes. The display parts can be hidden on different planes by bending of the bending part. Meanwhile, controlling the two display parts by a same driving chip also reduces complication of the system, which solves a technical problem of current display devices being not conducive to hiding independent display of the display panel.

10 Claims, 4 Drawing Sheets

(56) References Cited

FOREIGN PATENT DOCUMENTS

| | | |
|---|---|---|
| CN | 108399861 | 8/2018 |
| CN | 108648628 | 10/2018 |
| CN | 108847540 | 11/2018 |
| CN | 109686267 | 4/2019 |
| CN | 104765205 | 5/2021 |

* cited by examiner

DISPLAY DEVICE AND DISPLAY EQUIPMENT

RELATED APPLICATIONS

This application is a National Phase of PCT Patent Application No. PCT/CN2020/099108 having International filing date of Jun. 30, 2020, which claims the benefit of priority of Chinese Patent Application No. 202010395470.8 filed on May 12, 2020. The contents of the above applications are all incorporated by reference as if fully set forth herein in their entirety.

FIELD AND BACKGROUND OF THE INVENTION

The present disclosure relates to the field of foldable screen display technology, and particularly relates to a display device and a display equipment.

To satisfy different display functions, a plurality of display panels is used on current car instruments and audiovisual systems to achieve independent display. However, the plurality of display panel systems is complicated and is not conducive to hiding display.

Therefore, a technical problem of not conducive to hiding independent display of the display panel exists in current display devices.

SUMMARY OF THE INVENTION

The present disclosure provides a display device and a display equipment for solving the technical problem of not conducive to hiding independent display of the display panel existing in current display devices.

In order to solve the problems mentioned above, the present disclosure provides the technical solutions as follows:

An embodiment of the present disclosure provides a display device, including a display panel including at least two display parts and at least one bending part. The bending part is disposed between two adjacent display parts. When the bending part is bent, the display parts are located on different planes.

In the display device provided by the present disclosure, the display device further includes a housing and a storage component. The display panel includes a first display part and a second display part. The housing is used for storing the second display part. The storage component is used for storing and shifting out the second display part.

In the display device provided by the present disclosure, a top surface of the housing is cut out, and the storage component includes a pulley, a track, and a hinge. The track is disposed on an inner surface of a bottom surface of the housing. The pulley is disposed on a non-display region of a lateral side of the second display part. The hinge is disposed on the non-display region of a bottom side of the second display part. The pulley is disposed on and slides along the track.

In the display device provided by the present disclosure, when the second display part is shifted out by the hinge, the display panel rotates 90 degrees around the hinge. The display panel is perpendicular to the bottom surface of the housing in arrangement.

In the display device provided by the present disclosure, the storage component includes a rotating shaft. The rotating shaft is disposed close to the first display part. A bottom surface of the housing is cut out at a position close to the rotating shaft. When the second display part is stored in the housing, the second display part is bonded around the rotating shaft.

In the display device provided by the present disclosure, when the second display part is shifted out from the housing, the second display part extends outwards from a cut out from the bottom surface of the housing. The second display part and the first display part are located on a same plane.

In the display device provided by the present disclosure, the storage component includes at least two connection shafts. The connection shafts include a first connection shaft close to the first display part and a second connection shaft away from the first display part. A bottom surface of the housing is cut out at a position close to the first connection shaft. When the second display part is stored in the housing, two ends of the second display part are respectively connected to the first connection shaft and the second connection shaft.

In the display device provided by the present disclosure, when the second display part is shifted out from the housing, the second connection shaft is disposed at a position close to the first display part. The first connection shaft is disposed under the second connection shaft. The second display part and the first display part are located on a same plane.

In the display device provided by the present disclosure, the display device further includes a driving component. The driving component includes a driving chip and flat flexible cables. All the display parts are electrically connected to the driving chip by the flat flexible cables.

In the display device provided by the present disclosure, shapes of the first display part and the second display part are different, a shape of the first display part is any one of a circular shape, an ellipse, or a rectangle.

An embodiment of the present disclosure provides a display equipment including a display device and software. The display panel includes at least two display parts and at least one bending part. The bending part is disposed between two adjacent display parts. When the bending part is bent, the display parts are located on different planes.

In the display equipment provided by the present disclosure, the display device further includes a housing and a storage component. The display panel includes a first display part and a second display part. The housing is used for storing the second display part, and the storage component is used for storing and shifting out the second display part.

In the display equipment provided by the present disclosure, a top surface of the housing is cut out, and the storage component includes a pulley, a track, and a hinge. The track is disposed on an inner surface of a bottom surface of the housing. The pulley is disposed on a non-display region of a lateral side of the second display part. The hinge is disposed on the non-display region of a bottom side of the second display part. The pulley is disposed on and slides along the track.

In the display equipment provided by the present disclosure, when the second display part is shifted out by the hinge, the display panel rotates 90 degrees around the hinge. The display panel is perpendicular to the bottom surface of the housing in arrangement.

In the display equipment provided by the present disclosure, the storage component includes a rotating shaft. The rotating shaft is disposed close to the first display part. A bottom surface of the housing is cut out at a position close to the rotating shaft. When the second display part is stored in the housing, the second display part is bonded around the rotating shaft.

In the display equipment provided by the present disclosure, when the second display part is shifted out from the housing, the second display part extends outwards from a cut out from the bottom surface of the housing. The second display part and the first display part are located on a same plane.

In the display equipment provided by the present disclosure, the storage component includes at least two connection shafts. The connection shafts include a first connection shaft close to the first display part and a second connection shaft away from the first display part. A bottom surface of the housing is cut out at a position close to the first connection shaft. When the second display part is stored in the housing, two ends of the second display part are respectively connected to the first connection shaft and the second connection shaft.

In the display equipment provided by the present disclosure, when the second display part is shifted out from the housing, the second connection shaft is disposed at a position close to the first display part. The first connection shaft is disposed under the second connection shaft. The second display part and the first display part are located on a same plane.

In the display equipment provided by the present disclosure, the display equipment further includes a driving component, the driving component comprises a driving chip and flat flexible cables. All the display parts are electrically connected to the driving chip by the flat flexible cables.

In the display equipment provided by the present disclosure, shapes of the first display part and the second display part are different, a shape of the first display part is any one of a circular shape, an ellipse, or a rectangle.

The beneficial effect of the present disclosure is that the present disclosure provides the display device including the display panel including at least two display parts and at least one bending part, the bending part is disposed between two adjacent display parts, when the bending part is bent, the display parts are located on different planes, and bending different display parts to different plane eases the technical problem of not conducive to hiding independent display of the display panel existing in current display devices.

BRIEF DESCRIPTION OF THE SEVERAL VIEWS OF THE DRAWINGS

To more clearly illustrate embodiments or the technical solutions of the present disclosure, the accompanying figures of the present disclosure required for illustrating embodiments or the technical solutions of the present disclosure will be described in brief. Obviously, the accompanying figures described below are only part of the embodiments of the present disclosure, from which figures those skilled in the art can derive further figures without making any inventive efforts.

DESCRIPTION OF SPECIFIC EMBODIMENTS OF THE INVENTION

The descriptions of embodiments below refer to accompanying drawings in order to illustrate certain embodiments which the present disclosure can implement. The directional terms of which the present disclosure mentions, for example, "top", "bottom", "upper", "lower", "front", "rear", "left", "right", "inside", "outside", "side", etc., are just refer to directions of the accompanying figures. Therefore, the used directional terms are for illustrating and understanding the present disclosure, but not for limiting the present disclosure. In the figures, units with similar structures are indicated by the same reference numerals.

In the description of the present disclosure, it is to be understood that the orientation or positional relationship indicated by the terms "center", "longitudinal", "transverse", "length", "width", "thickness", "upper", "lower", "front", "rear", "left", "right", "vertical", "horizontal", "top", "bottom", "inside", "outside", "clockwise", "counterclockwise" etc. is based on the orientation or positional relationship shown in the accompanying figures, which is merely for the convenience for describing of the present disclosure and for the simplification of the description, and is not intended to indicate or imply that the indicated devices or elements have a specific orientation or is constructed and operated in a specific orientation. Therefore, it should not be understood as a limitation on the present disclosure. Moreover, the terms "first" and "second" are used for descriptive purposes only and are not to be understood as indicating or implying relative importance or implicitly indicating the number of the indicated technical characteristics. Therefore, the characteristics defined by "first" or "second" may include one or more of the described characteristics either explicitly or implicitly. In the description of the present disclosure, the meaning of "a plurality" is two or more unless clearly and specifically defined otherwise.

In the description of the present disclosure, unless specified or limited otherwise, terms "mounted," "connected," "coupled," and the like are used in a broad sense, and may include, for example, fixed connections, detachable connections, or integral connections; may also be mechanical or electrical connections or may be communication between each other; may also be direct connections or indirect connections via intervening structures; may also be inner communications of two elements or may be a relationship of interaction between two elements. For persons skilled in the art in this field, the specific meanings of the above terms in the present disclosure can be understood with specific cases.

In the present disclosure, unless expressly specified or limited otherwise, a first feature is "on" or "beneath" a second feature may include that the first feature directly contacts the second feature and may also include that the first feature does not directly contact the second feature. Furthermore, a first feature "on," "above," or "on top of" a second feature may include an embodiment in which the first feature is right "on," "above," or "on top of" the second feature and may also include that the first feature is not right "on," "above," or "on top of" the second feature, or just means that the first feature has a sea level elevation higher than the sea level elevation of the second feature. While first feature "beneath," "below," or "on bottom of" a second feature may include that the first feature is "beneath," "below," or "on bottom of" the second feature and may also include that the first feature is not right "beneath," "below," or "on bottom of" the second feature, or just means that the first feature has a sea level elevation lower than the sea level elevation of the second feature.

The following disclosure provides many different embodiments or examples for implementing the different structures of the present disclosure. In order to simplify the disclosure of the present disclosure, the components and configurations of the specific examples are described below. Of course, they are merely examples and are not intended to limit the present disclosure. In addition, the present disclosure may repeat reference numerals and/or reference numerals in different examples, which are for the purpose of simplicity and clarity, and do not indicate the relationship between the various embodiments and/or arrangements discussed. Moreover, the present disclosure provides embodiments of various specific processes and materials, but one of ordinary skill in the art will recognize the use of other processes and/or the use of other materials.

Hereinafter, the technical solution of the present disclosure is described with reference to specific embodiments.

Figure 1:
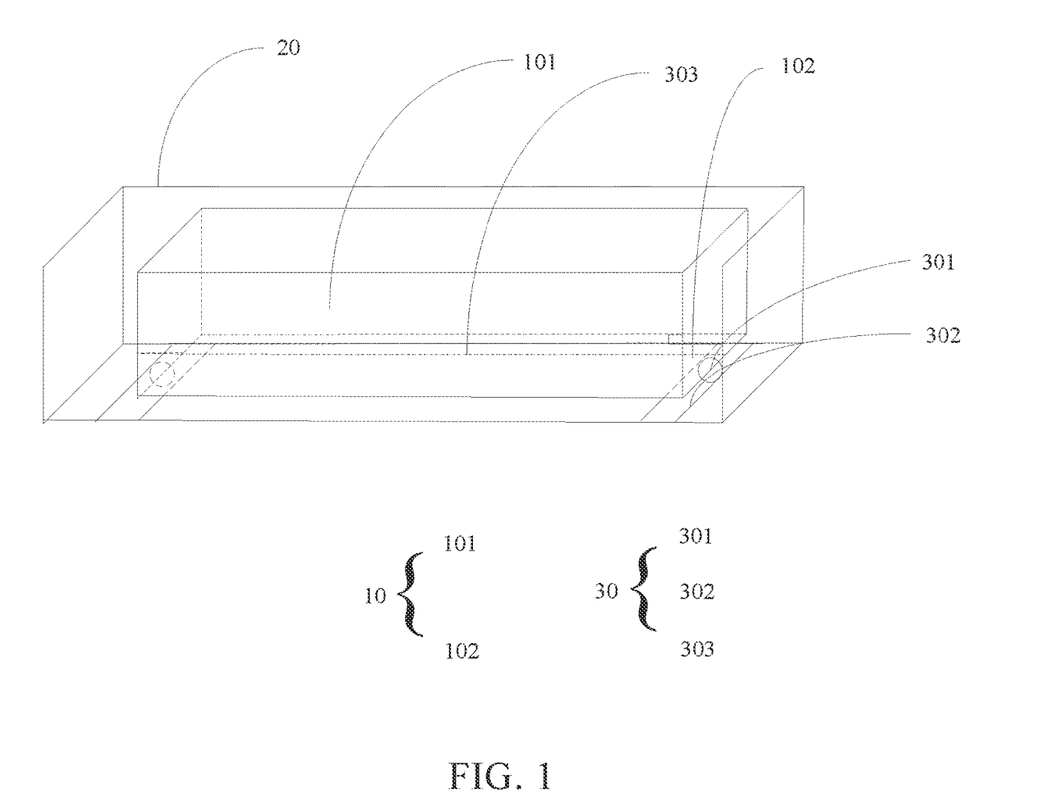
FIG. 1 is a schematic diagram of a display panel of a display device provided by an embodiment of the present disclosure.
Figure 2:
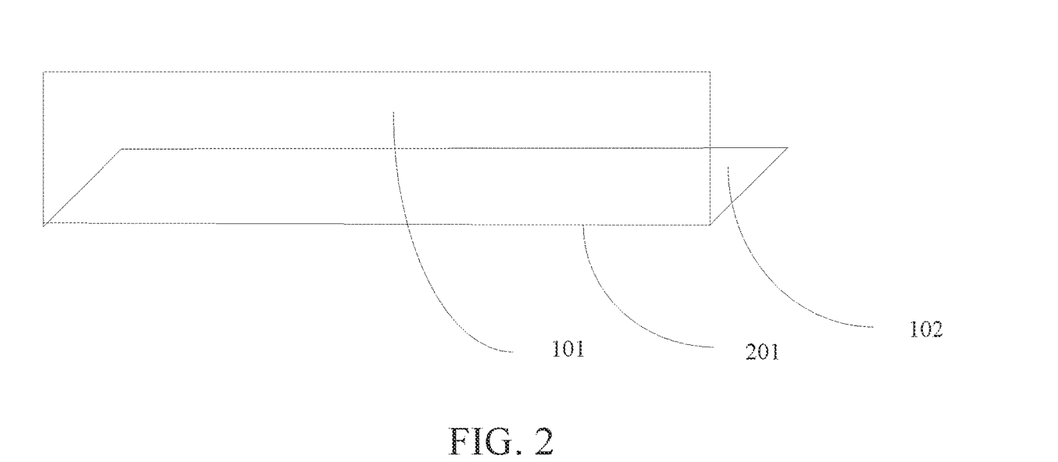
FIG. 2 is a schematic diagram of the display device provided by an embodiment of the present disclosure.

The display device provided by the present disclosure includes a display panel as illustrated in FIG. 1 and FIG. 2. The display panel includes at least two display parts 10 and at least one bending part 201. The bending part 201 is disposed between two adjacent display parts 10. When the bending part 201 is bent, the plurality of display parts 10 are located on different planes.

The display device provided by the present disclosure includes at least two display parts 10 and at least one bending part 201. The bending part 201 is disposed between two adjacent display parts 10. When the bending part 201 is bent, each of the display parts 10 are located on different planes. The display parts 10 can be hidden on different planes by the bending part 201. Meanwhile, controlling the two display parts by a same driving chip 401 also reduces complication of the system, which solves the technical problem of not conducive to hiding independent display of the display panel existing in current display devices.

In an embodiment, as illustrated in FIG. 1, in the display device, the display device further includes a housing 20 and a storage component 30. The display panel includes a first display part 101 and a second display part 102. The housing 20 is used for storing the second display part 102. The storage component 30 is used for storing and shifting out the second display part 102.

Furthermore, an angle between the first display part 101 and the second display part 102 may be less than 90 degrees.

Furthermore, an angle between the first display part 101 and the second display part 102 may be equal to 90 degrees.

In an embodiment as illustrated in FIG. 1, in the display device, a top surface of the housing 20 is cut out, and the storage component 30 includes a pulley 301, a track 302, and a hinge 303. The track 302 is disposed on an inner surface of a bottom surface of the housing 20. The pulley 301 is disposed on a non-display region of a lateral side of the second display part 102. The hinge 303 is disposed on the non-display region of a bottom side of the second display part 102. The pulley 301 is disposed on the track 302 and slides along the track 302.

Furthermore, a number of tracks 302 can be one or two.

Furthermore, a number of pulleys 301 can be configured according to number of tracks 302. The ratio between the number of pulleys 301 and the number of tracks 302 may be 1:1 or 2:1.

Furthermore, the number of pulleys 301 on each track 302 can be same.

Furthermore, the number of pulleys 301 on each track 302 can be different. For example, three pulleys 301 are disposed on one track 302, and one pulley 301 is disposed on another track 302.

In an embodiment and in the display device, when the second display part 102 is shifted out by the hinge 303, the display panel rotates 90 degrees around the hinge 303. The display panel is perpendicular to the bottom surface of the housing 20 in arrangement.

In the embodiment and in the display device, after the display panel is completely shifted out by movement of the pulley 301, the second display part 102 and the housing 20 are kept connection by the hinge 303 disposed on the bottom edge of the second display part 102, and the second display part 102 is guided to relatively rotate towards the housing 20 by rotation of the hinge.

In an embodiment and in the display device, the first display part 101 faces forward. After the second display part 102 is shifted out from the housing 20 by the track 302 and the pulley 301, the second display part 102 faces forward by rotation of the hinge.

Figure 3:
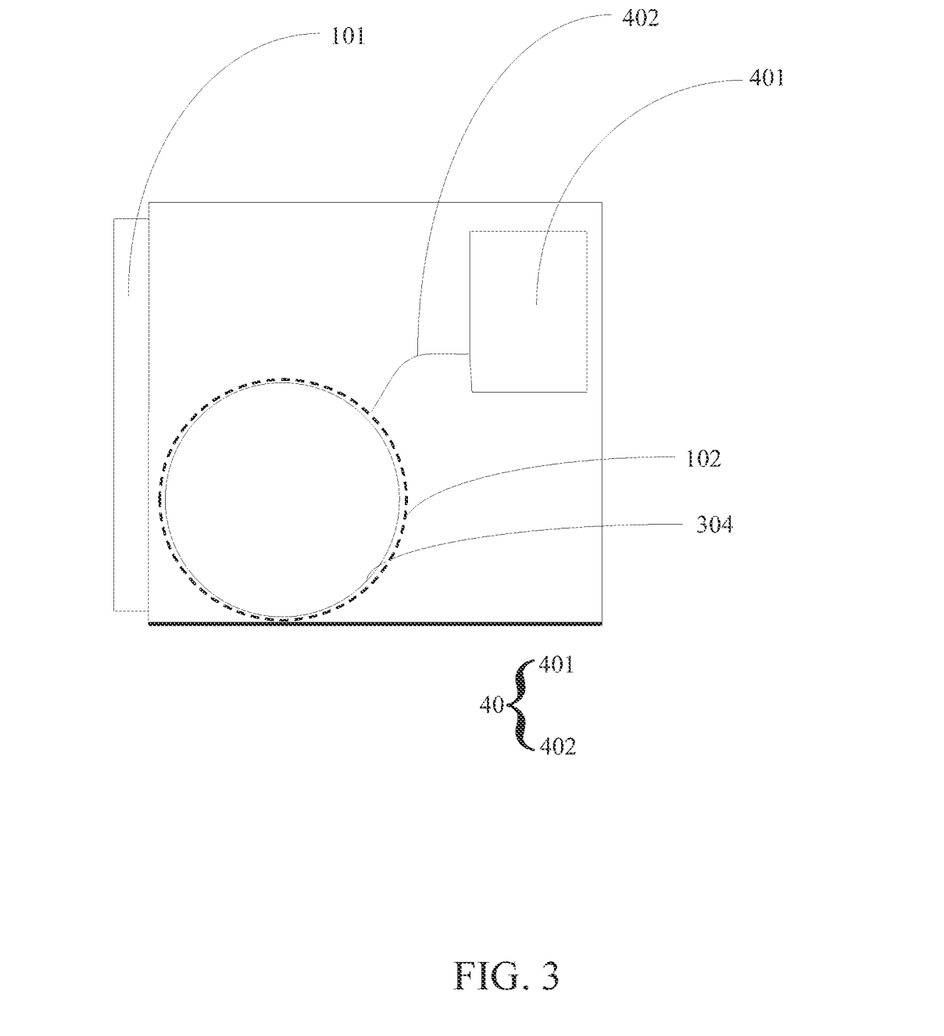
FIG. 3 is a first schematic lateral view of the display device provided by an embodiment of the present disclosure.

In an embodiment, as illustrated in FIG. 3, in the display device, the storage component 30 includes a rotating shaft 304. The rotating shaft 304 is disposed close to the first display part 101. A bottom surface of the housing 20 is cut out at a position close to the rotating shaft 304. When the second display part 102 is stored in the housing 20, the second display part 102 is bonded around the rotating shaft 304.

Furthermore, the number of rotating shafts 304 can be one or two.

In an embodiment and in the display device, when the second display part 102 is shifted out from the housing 20, the second display part 102 extends outwards from the cut out at the bottom surface of the housing 20. The second display part 102 and the first display part 101 are located on the same plane.

Furthermore, in the display device, the bottom surface of the housing 20 is cut out at the position close to the first display part 101, and the second display part 102 extends outwards from the cut out by rotation of the rotating shaft 304.

In an embodiment and in the display device, shapes of the first display part 101 and the second display part 102 are different, and the shape of the first display part 101 is any one of a circular shape, an ellipse, or a rectangle.

In an embodiment and in the display device, the shapes of the first display part 101 and the second display part 102 are the same.

In an embodiment and in the display device, the display panel further includes data lines. The first display part 101 and the second display part 102 are connected by the data lines. The two display parts independently display different scenes by control of one driving chip 401.

Figure 4:
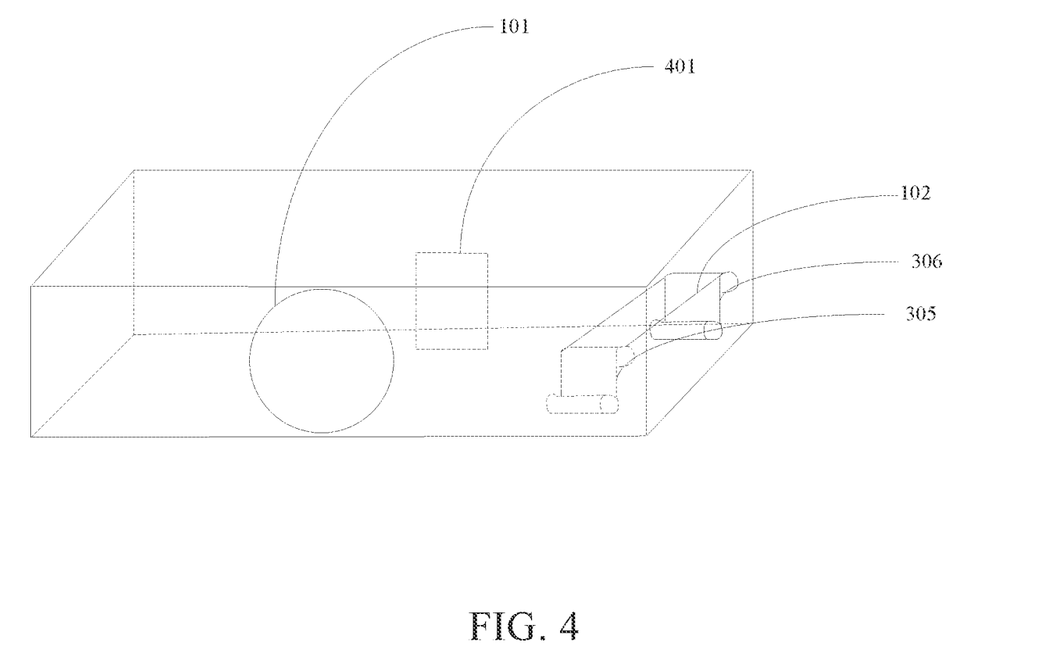
FIG. 4 is a schematic front view of the display device provided by an embodiment of the present disclosure.
Figure 5:
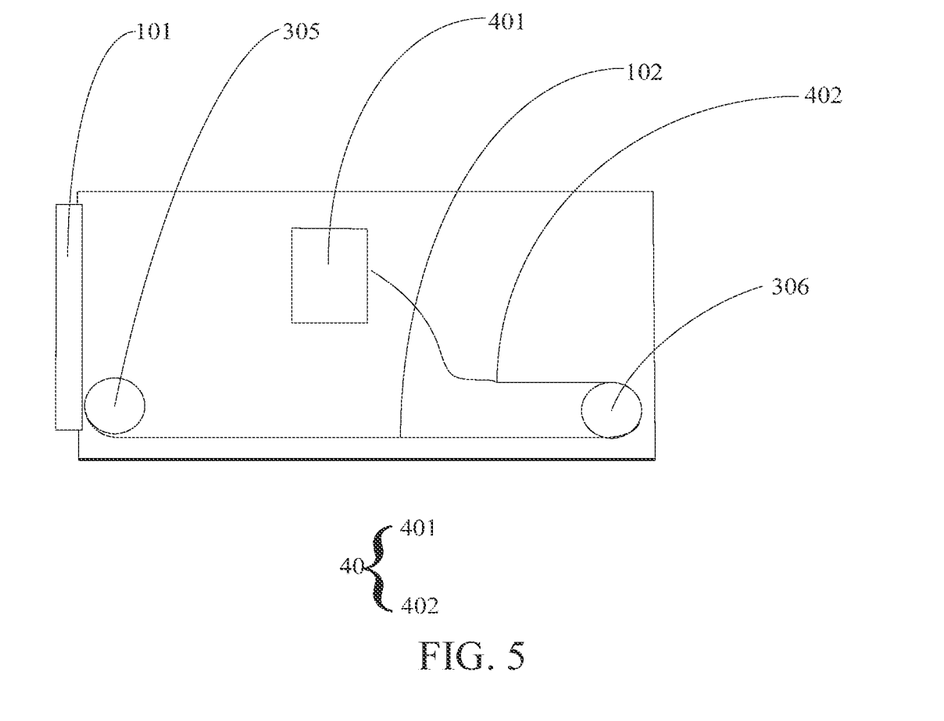
FIG. 5 is a second schematic lateral view of the display device provided by an embodiment of the present disclosure.

In an embodiment and in the display device, as illustrated in FIG. 4 and FIG. 5, the storage component 30 includes at least two connection shafts. The connection shafts include a first connection shaft 305 close to the first display part 101 and a second connection shaft 306 away from the first display part 101. A bottom surface of the housing 20 is cut out at a position close to the first connection shaft 305. When the second display part 102 is stored in the housing 20, two ends of the second display part 102 are respectively connected to the first connection shaft 305 and the second connection shaft 306.

Furthermore, in the display device, the bottom surface of the housing 20 is cut out at the position close to the first display part 101, and the second display part 102 extends outward from the cut out.

Furthermore, in the display device, when the second display part 102 is first shifted out, the first connection shaft 305 moves downward, the second connection shaft 306 moves toward a direction close to the first connection shaft 305, and the second display part 102 is kept in a flattened state.

In an embodiment and in the display device, when the second display part 102 is shifted out from the housing 20, the second connection shaft 306 is disposed at a position close to the first display part 101. The first connection shaft 305 is disposed under the second connection shaft 306. The second display part 102 and the first display part 101 are located on the same plane.

Furthermore, in the display device, when the second connection shaft 306 moves to a position close to the first display part 101, it will get stuck above the cut out. The first connection shaft 305 is shifted out from the cut out. The first connection shaft 305 and the second connection shaft 306 are located on a same vertical plane. The second display part 102 and the first display part 101 are located on a same plane, and the second display part 102 is unfolded and in the flattened state.

In an embodiment and in the display device, the display device further includes a driving component 40. The driving component 40 includes a driving chip 401 and flat flexible cables 402. All the display parts are electrically connected to the driving chip 401 by the flat flexible cables 402.

An embodiment of the present disclosure provides a display device as illustrated in FIG. 2. The display panel includes at least two display parts and at least one bending part 201. The bending part 201 is disposed between two adjacent display parts. When the bending part 201 is bent, the display parts are located on different planes.

Furthermore, an angle between the first display part 101 and the second display part 102 may be less than 90 degrees.

Furthermore, an angle between the first display part 101 and the second display part 102 may be equal to 90 degrees.

In an embodiment, shapes of the first display part 101 and the second display part 102 are different, and the shape of the first display part 101 is any one of a circular shape, an ellipse, or a rectangle.

In an embodiment, the shapes of the first display part 101 and the second display part 102 are same.

In an embodiment, the display panel further includes data lines. The first display part 101 and the second display part 102 are connected by the data lines. The two display parts independently display different scenes by control of one driving chip 401.

An embodiment of the present disclosure provides a display embodiment including a display panel and software. The display device includes a display panel. The display panel includes at least two display parts and at least one bending part 201. The bending part 201 is disposed between two adjacent display parts. When the bending part 201 is bent, the plurality of display parts are located on different planes.

In an embodiment and in the display equipment, the display equipment further includes a housing and a storage component. The display panel includes a first display part 101 and a second display part 102. The housing is used for storing the second display part 102. The storage component is used for storing and shifting out the second display part 102.

In an embodiment and in the display equipment, a top surface of the housing is cut out, and the storage component includes a pulley, a track, and a hinge. The track is disposed on an inner surface of a bottom surface of the housing. The pulley is disposed on a non-display region of a lateral side of the second display part 102. The hinge is disposed on the non-display region of a bottom side of the second display part 102. The pulley is disposed on and slides along the track.

In an embodiment and in the display equipment, when the second display part 102 is shifted out by the hinge, the display panel rotates 90 degrees around the hinge, and the display panel is perpendicular to the bottom surface of the housing in arrangement.

In an embodiment and in the display equipment, the storage component includes a rotating shaft. The rotating shaft is disposed close to the first display part 101. A bottom surface of the housing is cut out at a position close to the rotating shaft. When the second display part 102 is stored in the housing, the second display part 102 is bonded around the rotating shaft.

In an embodiment and in the display equipment, when the second display part 102 is shifted out from the housing, the second display part 102 extends from the cut out from the bottom surface of the housing. The second display part 102 and the first display part 101 are located on a same plane.

In an embodiment and in the display equipment, the storage component includes at least two connection shafts. The connection shafts include a first connection shaft close to the first display part 101 and a second connection shaft away from the first display part 101. A bottom surface of the housing is cut out at a position close to the first connection shaft. When the second display part 102 is stored in the housing, two ends of the second display part 102 are respectively connected to the first connection shaft and the second connection shaft.

In an embodiment and in the display equipment, when the second display part 102 is shifted out from the housing, the second connection shaft is disposed at a position close to the first display part 101. The first connection shaft is disposed under the second connection shaft. The second display part 102 and the first display part 101 are located on a same plane.

In an embodiment and in the display equipment, the display equipment further includes a driving component. The driving component includes a driving chip and flat flexible cables. All the display parts are electrically connected to the driving chip by the flat flexible cables.

In an embodiment and in the display equipment, shapes of the first display part 101 and the second display part 102 are different, and the shape of the first display part 101 is any one of a circular shape, an ellipse, or a rectangle.

According to embodiments mentioned above:

A display device is provided by the present disclosure. The display device includes a display panel. The display panel includes at least two display parts and at least one bending part. The bending part is disposed between two adjacent display parts. When the bending part is bent, the plurality of display parts are located on different planes. The display parts are hidden on different planes by bending of the bending part. Meanwhile, controlling the two display parts by a same driving chip also reduces complication of the system, which solves the technical problem of not conducive to hiding independent display of the display panel existing in current display devices.

In summary, although the present disclosure has disclosed the preferred embodiments as above, however the above-mentioned preferred embodiments are not to limit to the present disclosure. A person skilled in the art can make any change and modification, therefore the scope of protection of the present disclosure is subject to the scope defined by the claims.

What is claimed is:

1. A display device, comprising a display panel comprising at least two display parts, at least one bending part, a housing, a storage component, a first display part, and a second display part, wherein the bending part is disposed between two adjacent display parts, when the bending part is bent, the display parts are located on different planes;

wherein the housing is used for storing the second display part, and the storage component is used for storing and shifting out the second display part; and wherein a top surface of the housing is cut out, the storage component comprises a pulley, a track, and a hinge; the track is disposed on an inner surface of a bottom surface of the housing, the pulley is disposed on a non-display region of a lateral side of the second display part, the hinge is disposed on the non-display region of a bottom side of the second display part, and the pulley is disposed on and slides along the track; or the storage component comprises at least two connection shafts, the connection shafts comprise a first connection shaft close to the first display part and a second connection shaft away from the first display part, and a bottom surface of the housing is cut out at a position close to the first connection shaft, enabling two ends of the second display part to be respectively connected to the first connection shaft and the second connection shaft when the second display part is stored in the housing.

2. The display device as claimed in claim 1, wherein when the second display part is shifted out by the hinge, the display panel rotates 90 degrees around the hinge, and the display panel is perpendicular to the bottom surface of the housing in arrangement.

3. The display device as claimed in claim 1, wherein when the second display part is shifted out from the housing, the second connection shaft is disposed at a position close to the first display part, the first connection shaft is disposed under the second connection shaft, and the second display part and the first display part are located on a same plane.

4. The display device as claimed in claim 1, wherein the display device comprises a driving component, the driving component comprises a driving chip and flat flexible cables, and all the display parts are electrically connected to the driving chip by the flat flexible cables.

5. The display device as claimed in claim 1, wherein shapes of the first display part and the second display part are different, a shape of the first display part is any one of a circular shape, an ellipse, or a rectangle.

6. A display equipment, comprising a display panel comprising at least two display parts at least one bending part, a housing, a storage component, a first display part, and a second display part, wherein the bending part is disposed between two adjacent display parts, when the bending part is bent, the display parts are located on different planes;

wherein the housing is used for storing the second display part, and the storage component is used for storing and shifting out the second display part; and wherein a top surface of the housing is cut out, the storage component comprises a pulley, a track, and a hinge; the track is disposed on an inner surface of a bottom surface of the housing, the pulley is disposed on a non-display region of a lateral side of the second display part, the hinge is disposed on the non-display region of a bottom side of the second display part, and the pulley is disposed on and slides along the track; or the storage component comprises at least two connection shafts, the connection shafts comprise a first connection shaft close to the first display part and a second connection shaft away from the first display part, and a bottom surface of the housing is cut out at a position close to the first connection shaft, enabling two ends of the second display part to be respectively connected to the first connection shaft and the second connection shaft when the second display part is stored in the housing.

7. The display equipment as claimed in claim 6, wherein when the second display part is shifted out by the hinge, the display panel rotates 90 degrees around the hinge, and the display panel is perpendicular to the bottom surface of the housing in arrangement.

8. The display equipment as claimed in claim 6, wherein when the second display part is shifted out from the housing, the second connection shaft is disposed at a position close to the first display part, the first connection shaft is disposed under the second connection shaft, and the second display part and the first display part are located on a same plane.

9. The display equipment as claimed in claim 6, wherein the display equipment comprises a driving component, the driving component comprises a driving chip and flat flexible cables, and all the display parts are electrically connected to the driving chip by the flat flexible cables.

10. The display equipment as claimed in claim 6, wherein shapes of the first display part and the second display part are different, a shape of the first display part is any one of a circular shape, an ellipse, or a rectangle.

* * * * *